US008791771B2

(12) United States Patent
Ding et al.

(10) Patent No.: US 8,791,771 B2

(45) Date of Patent: Jul. 29, 2014

(54) RECONFIGURABLE WILKINSON POWER DIVIDER AND DESIGN STRUCTURE THEREOF

(75) Inventors: Hanyi Ding, Colchester, VT (US); Guoan Wang, South Burlington, VT (US); Wayne H. Woods, Jr., Burlington, VT (US); Jiansheng Xu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 179 days.

(21) Appl. No.: 13/298,489

(22) Filed: Nov. 17, 2011

(65) Prior Publication Data

US 2013/0127564 A1 May 23, 2013

(51) Int. Cl.
*H01P 5/12* (2006.01)
*H03L 5/00* (2006.01)

(52) U.S. Cl.
USPC ............................ 333/125; 327/333; 327/100

(58) Field of Classification Search
USPC .......... 327/306, 333; 333/100, 124, 101, 104, 333/125, 136
See application file for complete search history.

(56) References Cited

U.S. PATENT DOCUMENTS

| | | | | |
|---|---|---|---|---|
| 4,604,591 | A | 8/1986 | Vasile | |
| 5,075,648 | A | 12/1991 | Roberts et al. | |
| 6,005,442 | A * | 12/1999 | Maeda et al. | 330/295 |
| 6,054,907 | A * | 4/2000 | Sjogren | 333/161 |
| 6,959,062 | B1 | 10/2005 | Stubbs | |
| 7,248,130 | B2 | 7/2007 | Bohlman | |
| 7,352,325 | B1 | 4/2008 | Floyd et al. | |
| 7,368,311 | B2 | 5/2008 | Tilmans et al. | |
| 7,750,740 | B2 | 7/2010 | Inoue | |
| 2002/0069374 | A1 | 6/2002 | Kopser et al. | |
| 2004/0153684 | A1 | 8/2004 | Liu et al. | |
| 2005/0062137 | A1 | 3/2005 | Singh et al. | |
| 2005/0262459 | A1 | 11/2005 | Schumann | |
| 2006/0164141 | A1 | 7/2006 | Self | |
| 2007/0268090 | A1 | 11/2007 | Razmpoosh | |
| 2009/0189725 | A1 | 7/2009 | Ding et al. | |
| 2009/0315633 | A1 | 12/2009 | Ding et al. | |
| 2009/0315641 | A1 | 12/2009 | Ding et al. | |

OTHER PUBLICATIONS

Oh, S. et al., "An Unequal Wilkinson Power Divider with Variable Dividing Ratio", IEEE, 2007, pp. 411-414.
Lourandakis, E. et al., "A Tunable and Reduced Size Power Divider Using Ferroelectric Thin-Film Varactors", IEEE, 2008, pp. 967-970.
Perrier, A-L. et al., "A Semi-Lumped Miniaturized Spurious Less Frequency Tunable Three-port Divider\Combiner with 20 dB Isolation Between Output Ports", IEEE, 2006, pp. 1714-1717.
Li, C. et al., "A High Frequency Tunable Differential Active Inductor and Its Application to Power Dividers", IEEE, 2008, pp. 285-288.

(Continued)

*Primary Examiner* — Dinh T. Le

(74) *Attorney, Agent, or Firm* — Anthony Canale; Roberts Mlotkowski Safran & Cole, P.C.

(57) ABSTRACT

A reconfigurable Wilkinson power divider, methods of manufacture and design structures are provided. The structure includes a first port, and a first arm and a second arm connected to the first port. The first arm and the second arm each include one or more tunable t-line circuits. The structure also includes a second port and a third port connected to the first port via the first arm and second arm, respectively.

21 Claims, 13 Drawing Sheets

(56) References Cited

OTHER PUBLICATIONS

Lehmann, T. et al., "Reconfigurable Wilkinson power dividers with minimum number of switches", Electronics Letters, vol. 45, No. 2, Jan. 15, 2009, 2 pages.
P.A. Brennan, et al.; "Delay Line for Use with Integrated Circuits"; Apr. 1967; IBM TDB 04-67, Abstract.
E.P. Harris; "Superconducting Delay Line With Electronically Variable Delay"; Oct. 1972; IBM TDB 10-72, Abstract.
S.B. Kaplan; "Variable on Chip Delay Line with Josephson Devices"; Mar. 1983; IBM TDB 03-83, Abstract.
Woods et al., "Analysis and Measurement of a Novel On-Chip Variable Delay Transmission Line with Fixed Characteristic Impedance", IEEE SiRF, Jan. 2010 (4 pages).

* cited by examiner

RECONFIGURABLE WILKINSON POWER DIVIDER AND DESIGN STRUCTURE THEREOF

FIELD OF THE INVENTION

The invention relates to semiconductor structures and, more particularly, to reconfigurable Wilkinson power dividers, and methods of manufacture and use, and design structure thereof.

BACKGROUND

An ideal Wilkinson power divider is a three-port network that is lossless when the input and output ports are matched to the incoming and outgoing signal lines. In a Wilkinson power divider, the power at the input port can be split into two or more output signals which are in phase and have the same amplitude. High isolation between the output ports can be obtained for a two-way Wilkinson power divider using quarter-wavelength transformers having a characteristic impedance of sqrt(2)*$Z_o$ and a lumped isolation resistor of $2Z_o$ with all the ports having a matched impedance, $Z_o$. The transformer only has the correct electrical length of a quarter-wavelength at one specific frequency, which amounts to a narrow-band matching technique.

In ideal Wilkinson power dividers, the output signals are 3 dB below the input signal, and they are also in phase. In an ideal Wilkinson power divider the output ports are mutually isolated. Isolation is the ratio of a signal entering a first output that is measured at a second output, assuming all ports are impedance matched. In a Wilkinson power divider, isolations better than −20 dB can be achieved. However, as noted above, conventional Wilkinson power dividers make use of a narrow-band matching technique, based on its structure.

Accordingly, there exists a need in the art to overcome the deficiencies and limitations described hereinabove.

SUMMARY

In an aspect of the invention, a device comprises a first port. The device further comprises a first arm and a second arm connected to the first port. The first arm and the second arm each comprise one or more tunable t-line circuits. The device also comprises a second port and a third port connected to the first port via the first arm and second arm, respectively.

In another aspect of the invention, a method comprises adjusting at least one of a capacitance or an inductance of a characteristic impedance of a power divider by turning on at least one of a first switch or a second switch of a tunable t-line circuit implemented in the power divider, thereby modifying an output signal of the power divider.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the reconfigurable Wilkinson power divider, which comprises the structures of the present invention.

In still further embodiments, a method in a computer-aided design system is provided for generating a functional design model of the reconfigurable Wilkinson power divider. The method comprises generating a functional representation of a first port; of a first arm and a second arm connected to the first port, wherein the first and second arm each comprise one or more tunable t-line circuits; and a second port and a third port connected to the first port via the first arm and second arm, respectively.

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

The invention relates to semiconductor structures and, more particularly, to reconfigurable Wilkinson power dividers, and methods of manufacture and design structure thereof. The Wilkinson power divider includes a first port having a characteristic impedance $Z_o$ connected to two arms, preferably quarter-wave impedance transformers, and the arms include tunable t-line circuits. The Wilkinson power divider also includes a second port and a third port, both coupled to the first port via the arms. A resistor is connected between the second and third ports.

Advantageously, the present invention provides for tunable t-line circuits, which enable the tunability of a reconfigurable Wilkinson power divider. The tunable t-line circuits are structured to maintain a constant characteristic impedance while varying the delay of the Wilkinson power divider. The tunable t-line circuits can also be structured to modify the characteristic impedance to combat process variations. Also, the reconfigurable Wilkinson power divider of the present invention shifts operating frequencies while optimizing isolation and matching. Additionally, the reconfigurable Wilkinson power divider combats process variations and matches dynamic input/output loads.

Figure 1:
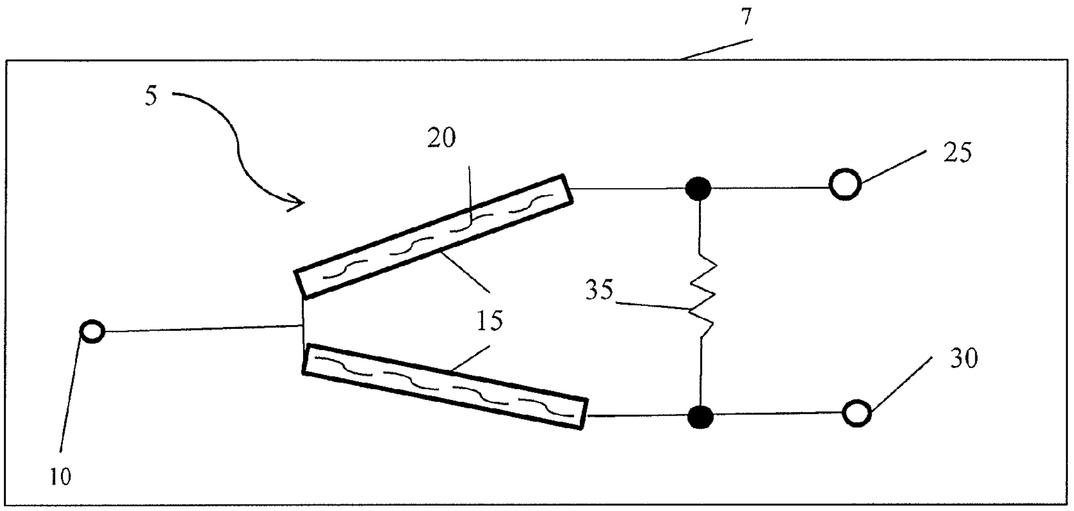
FIG. 1 shows a Wilkinson power divider in accordance with aspects of the present invention.

FIG. 1 shows a Wilkinson power divider according to aspects of the present invention. More specifically, FIG. 1 shows a 2-way Wilkinson power divider 5 formed on a substrate 7. Although FIG. 1 shows a 2-way Wilkinson power divider 5, it should be understood by those having ordinary skill in the art that the present invention may be implemented with any n-way Wilkinson power divider. The Wilkinson power divider 5 includes a first port 10 having a characteristic impedance $Z_o$ connected to two arms 15, preferably quarter-wave impedance transformers. In an ideal Wilkinson power divider, the two arms 15 have a characteristic impedance of sqrt(2)*$Z_o$ so that the input is matched when the outputs are terminated in $Z_o$. The arms 15 include tunable t-line circuits 20, discussed in further detail below.

The Wilkinson power divider 5 also includes a second port 25 and a third port 30, both coupled to the first port 10 via the arms 15. A resistor 35 is connected between ports 25 and 30. In an ideal Wilkinson power divider, the resistor has an impedance of $2Z_o$. In embodiments, the ports 25 and 30 are at equal potential, and as such, no current flows across the resistor 35 thereby decoupling it from the input. As a power divider, the device 5 receives a signal at port 10 and divides the signal into two signals at ports 25 and 30. As a power combiner, the device 5 receives a signal at either or both ports 25 and 30, and combines the signal(s) at port 10.

Figure 2:
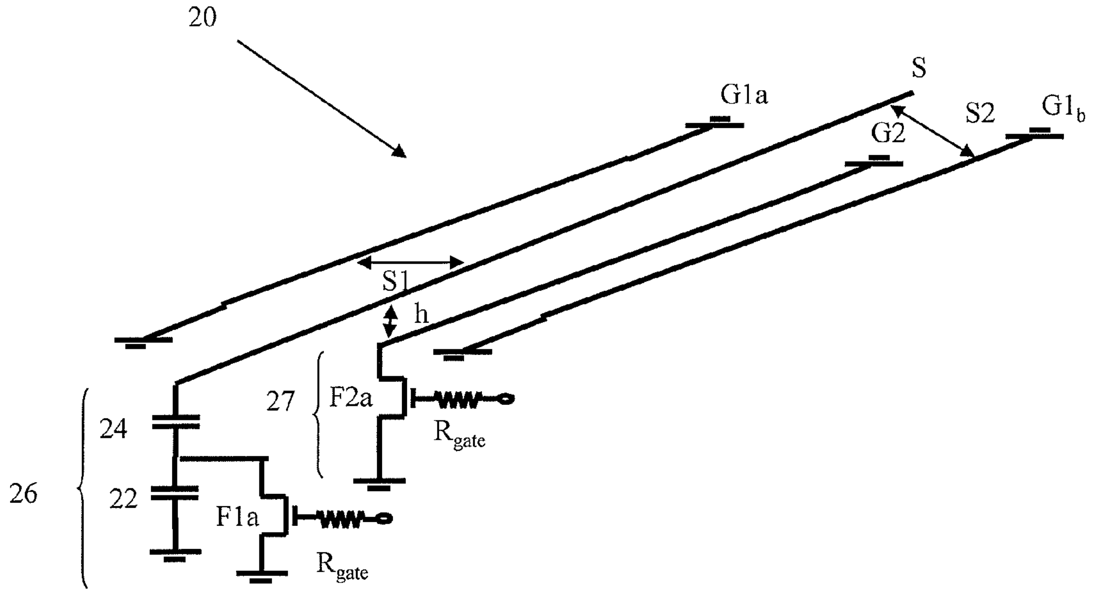
FIG. 2 shows a tunable t-line circuit implemented in a Wilkinson power divider in accordance with aspects of the present invention.

FIG. 2 shows a tunable t-line circuit implemented in a Wilkinson power divider in accordance with aspects of the present invention. More specifically, FIG. 2 shows a representative tunable t-line circuit with functionally differentiated switches, generally represented at reference numeral 20. The structure 20 includes ground return lines G1*a* and $G1_b$ and inductor control line G2. The ground return lines G1*a* and $G1_b$ are both connected to ground Gnd. The structure 20 further includes a signal line S. In embodiments, the ground control line G1*a* and adjacent signal line S have a spacing of S1, and the signal line and inductor control line G2 have a spacing "h". Moreover, the ground control line $G1_b$ and signal line S have a spacing of S2. As should be understood by those of skill in the art, the spacings will affect inductance and capacitance, which can be compensated by use of switches 26, 27 of structure 20 (discussed in more detail below).

Still referring to FIG. 2, the switch 26 includes transistor $F1_a$ connected in parallel with a capacitor 22, and capacitor 22 connected to a capacitor 24, in series. The transistor $F1_a$ and capacitors 22, 24 are connected to the signal line S. In this configuration, the transistor $F1_a$ switches line capacitance by either acting as a resistor in the on state or a capacitor in the off state. For example, in the off state, the effective capacitance of the transistor becomes that of capacitor 22 and the transistor $F1_a$ in parallel, and the capacitance of capacitor 24, in series. The configuration of the transistor $F1_a$ can be used to change the characteristic impedance or maintain a constant characteristic impedance by compensating for a change in the inductance caused by a change in transistor $F2_a$.

The structure 20 also includes a switch 27 represented by a transistor $F2_a$ connected to a resistor Rgate and the inductor control line G2. In this configuration, thus, the transistor $F2_a$ switches the line inductance. In embodiments, the resistor Rgate is an RF isolation resistor, which can have a value of, for example, about 10 KΩ. In embodiments, a potential connected to the Rgate can turn the transistor $F2_a$ on or off to and Rgate blocks any RF leakage.

In operation, the transistor $F1_a$ switches the line capacitance of the signal line S. The transistor $F2_a$, on the other hand, switches the line inductance through the inductor control line G2. When the transistor $F1_a$ is on and the transistor $F2_a$ is off, the structure 20 is in the slow state. On the other hand, when the transistor $F1_a$ is off and the second switch $F2_a$ is on, the structure 20 is in the fast state. In this way, the circuit of the present invention acts like a variable capacitance and variable inductance, e.g., the circuit changes capacitance when the transistors $F1_a$, $F2_a$ are turned on and off. The aforementioned tunable t-line is discussed in U.S. application Ser. No. 12/911,327 which is hereby incorporated by reference.

Figure 3A:
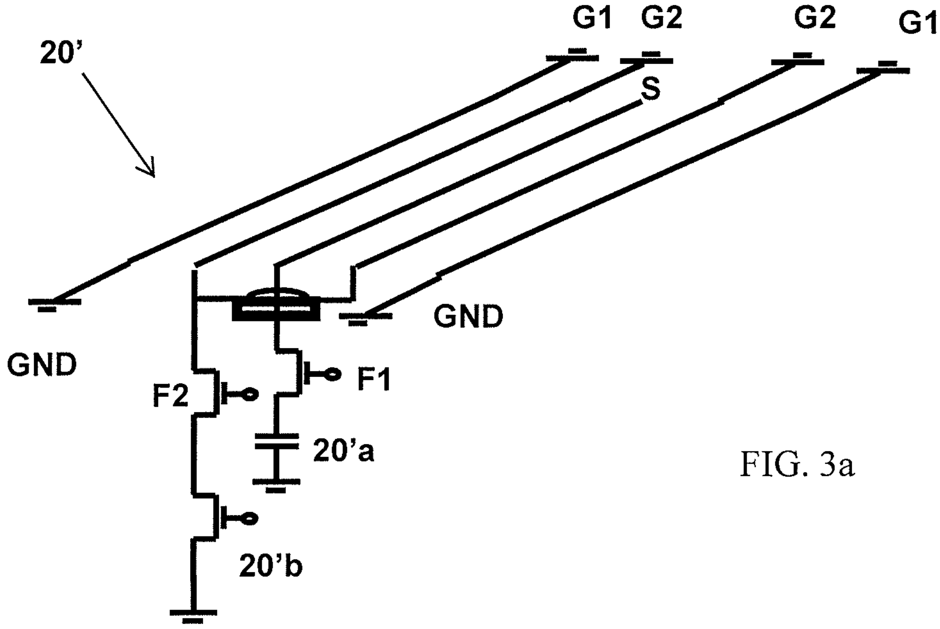
FIG. 3*a* shows a tunable t-line circuit implemented in a Wilkinson power divider in accordance with aspects of the present invention.

FIG. 3*a* shows an alternate tunable t-line circuit implemented in a Wilkinson power divider 5 in accordance with aspects of the present invention. More specifically, FIG. 3*a* shows a representative tunable t-line circuit with functionally differentiated switches. The structure 20' includes ground return lines G1 and inductor control lines G2. The ground return lines G1 are both connected to ground GND. The structure 20' further includes a signal line S. In embodiments, a transistor F1 is connected in series with a capacitor 20'*a* to the signal line S. Also, a transistor F2 is connected in series with another transistor 20'*b* to the inductor control lines G2. In embodiments, the transistors, F1, F2 and 20'*b* are FETs, formed using conventional CMOS processes.

In operation, the transistor F1 switches the line capacitance of the signal line S. The transistor F2, on the other hand, switches the line inductance through the inductor control lines G2. When the transistor F1 is on and the transistor F2 is off, the structure 20' is in the slow state. On the other hand, when the transistor F1 is off and the transistor F2 is on, the structure 20' is in the fast state. In this way, the structure 20' acts like a variable capacitance and a variable inductance, e.g., the circuit changes capacitance and inductance when the transistors F1, F2 are turned on and off. That is, as described below, the circuit of the present invention is capable of adjusting capacitance and inductance in unison to maintain a fixed impedance of the structure. Also, in embodiments, the transistor 20'*b* can always remain off to act like a large capacitance, which may be the same size as transistor F2.

Figure 3B:
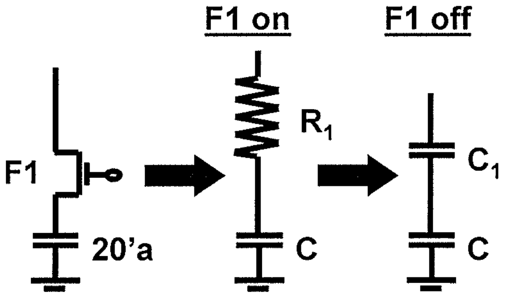
FIGS. 3*b* and 3*c* are representative circuits of FIG. 3*a* in an on state and off state, respectively.

FIG. 3*b* is a representative circuit of the transistor F1 in the on state and the off state. More specifically, in the on state of transistor F1, the circuit effectively becomes a resistor $R_1$ in series with the capacitor C (e.g., capacitor 20'*a*). In embodiments, $R_1$ can be relatively high and still provide effective additional capacitance to the signal line S. For example, the resistance $R_1$ can be greater than 5Ω. Accordingly, the transistor F1 effectively becomes a resistor in the on state. In the off state of transistor F1, the circuit effectively becomes two capacitors $C_1$ and C, in series. Accordingly, the transistor F1 effectively becomes a capacitor in the off state. The capacitor C, in either the on state or the off state, is representative of an additional signal line capacitance in the slow state. Also, $(C_1C)/(C_1+C)$ is representative of an additional signal line capacitance of a fast state.

Figure 3C:
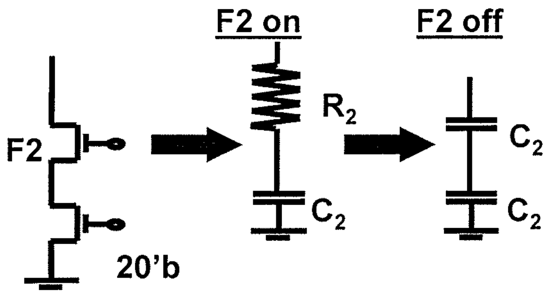

FIG. 3*c* is a representative circuit of the transistor F2 in the on state and the off state. In either of the on state or the off state, transistor 20'*b* remains off and, hence, acts like a large capacitance. In the on state of transistor F2, the circuit effectively becomes a resistor $R_2$ in series with the capacitor $C_2$ (e.g., capacitor 20'*a*). In embodiments, $R_2$ can be low such as, for example, less than 5Ω, to reduce any losses in the return path. In the off state of transistor F2, the circuit effectively becomes two capacitors $C_2$ and $C_2$, in series. The capacitor $C_2$ is equivalent to the resonant return current capacitance in the slow state. Also, ½ $C_2$ is representative of the resonant return current capacitance in the fast state.

In the representation of FIG. 3*c*, both transistors F2 and 20'*b*, in series, act as a two state variable capacitor. In this way, inductance of the signal line S can be fixed (or changed) by varying the capacitance. Also, by effectively changing the FET (transistor) capacitance from $C_2$ to ½ $C_2$, the transition frequency can be doubled allowing inductance to be changed between two states over a wide band.

Figure 4:
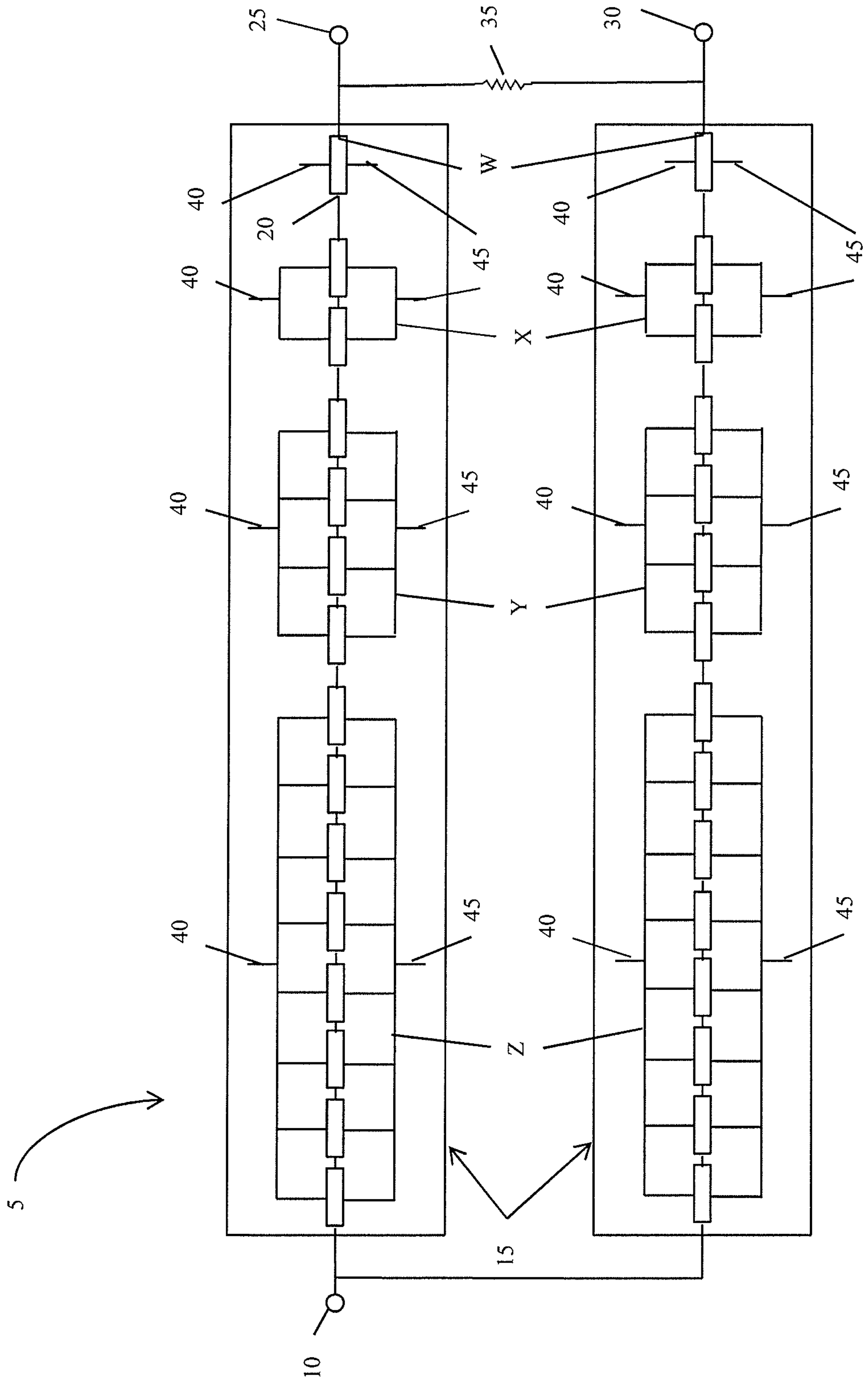
FIG. 4 shows a design layout of a Wilkinson power divider in accordance with aspects of the present invention.

FIG. 4 shows a design layout of a Wilkinson power divider 5 in accordance with aspects of the present invention. More specifically, FIG. 4 shows a design layout of a 2-way Wilkinson power divider 5. Although FIG. 4 shows a 2-way Wilkinson power divider 5, it should be understood that the present invention may be implemented with any n-way Wilkinson power divider. The Wilkinson power divider 5 includes a first port 10 having a characteristic impedance $Z_o$ connected to two arms 15, preferably quarter-wave impedance transformers. The arms 15 include tunable t-line circuits 20 as discussed with respect to FIGS. 2 and 3*a*-3*c*. The Wilkinson power divider 5 also includes a second port 25 and a third port 30 which are coupled to the first port 10 via the arms 15. A resistor 35 is connected between ports 25 and 30. The Wilkinson power divider 5 further includes inductance controls 40 and capacitance controls 45. The inductance controls 40 and capacitance controls 45 provide control bits to the FETs of the tunable t-line circuits 20, which control the current in the inductance control line G2 or the capacitance of the signal line S as shown in FIG. 2 or 3*a*.

By using the inductor control line and signal line (as shown in FIG. 2 or 3*a*), the tunable t-line circuit 20 can vary its inductance and capacitance. In this way, as implemented in a Wilkinson power divider 5, the Wilkinson power divider 5 can be reconfigurable. For example, the tunable t-line circuits 20 can be reconfigured to maintain a constant characteristic impedance $Z_o$ with varying delays, with the characteristic impedance defined as sqrt(L/C), where L is the inductance and C is the capacitance. Likewise, in embodiments, when the tunable t-line circuits 20 are reconfigured by modifying the inductance, the capacitance should be modified at the same ratio to maintain $Z_o$, and vice-versa. In embodiments, the tunable t-line circuits 20 may alternatively be reconfigured to have different characteristic impedances $Z_o$ to combat process variations. For example, the inductance may be increased without modifying the capacitance. Accordingly, the tunable t-line circuits 20 enable the impedance of the arms 15 to be modified to achieve a variety of performance enhancements. For example, the present invention can be used for frequency tuning, to combat process variations, and/or match dynamic input/output loads. Additionally, the present invention can be used for simultaneous frequency tuning, matching, and isolation optimization. Accordingly, the Wilkinson power divider 5 of the present invention may be reconfigured by tuning the t-line circuit 20 to achieve the desired performance sought.

Still referring to FIG. 4, the arms 15 includes four groups of tunable t-line circuits 20. More specifically, FIG. 4 shows groups W, X, Y, and Z. In embodiments, group W has one tunable t-line circuit 20, group X has two tunable t-line circuits 20, group Y has four tunable t-line circuits 20, and group Z has eight tunable t-line circuits 20. It should be understood that FIG. 4 is only an exemplary embodiment, and that more or less groups with a different number of tunable t-line circuits 20 can also be implemented with the present invention. In embodiments, the number of tunable t-line circuits 20 and groupings can be implemented based on desired performance enhancements. For example, the number of tunable t-line circuits 20 and groups can be reconfigured based on an achievable desired inductance or capacitance value of the Wilkinson power divider 5. Illustratively, the arms 15 may include a different number of groups, with each group containing the same number of tunable t-line circuits 20 or a different number of tunable t-line circuits 20. In embodiments, each successive group, for example, can include an additional tunable t-line circuit 20 than a previous group.

Figure 5:
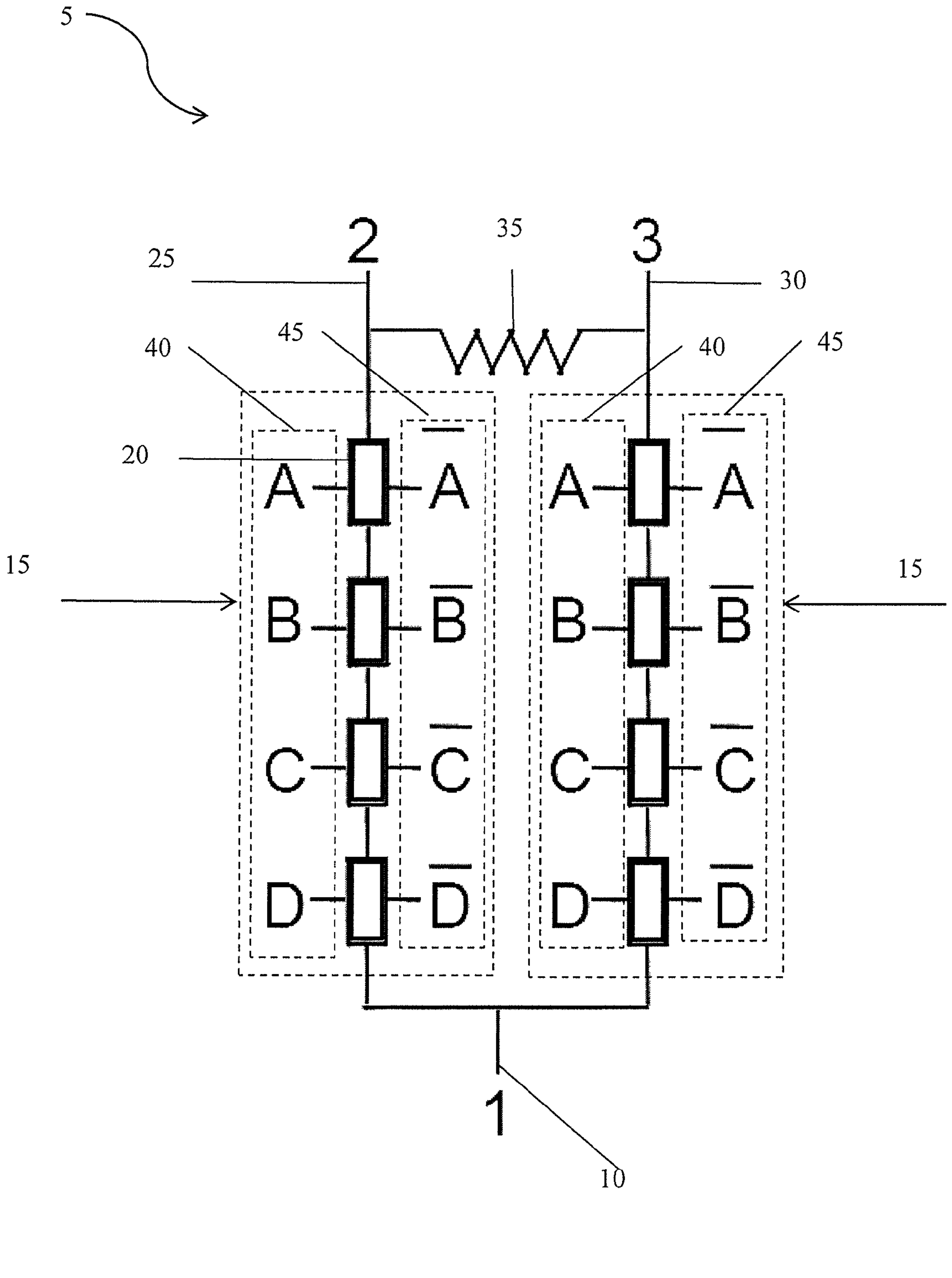
FIG. 5 shows a Wilkinson power divider with four control bits in accordance with aspects of the present invention.

FIG. 5 shows a reconfigurable Wilkinson power divider 5 with four control bits in accordance with aspects of the present invention. More specifically, FIG. 5 shows a reconfigurable Wilkinson power divider 5 with control bits A-D and complementary control bits $\overline{A}$-$\overline{D}$, each associated with a group of tunable t-line circuits 20 within each arm 15. The control bits are connected to the FETs, which control the current in the inductance control line G2 or the capacitance of the signal line S in FIG. 2 or 3*a* of the tunable t-line section. Because the Wilkinson power divider 5 is operating with 4 bits, it has sixteen (16) different operating states, e.g. $2^4$ states. For example, an inductance control bit A is turned on (i.e., a voltage of 0.9V is applied) and $\overline{A}$ remains at 0V, and the remaining bits B-D and complementary bits all remain at 0V. In this embodiment, the characteristic impedance remains constant; however, the use of the tunable t-lines enables the output signals to be delayed. Therefore, this embodiment may be used to minimize $Z_o$ variation while changing the frequency.

Figure 6:
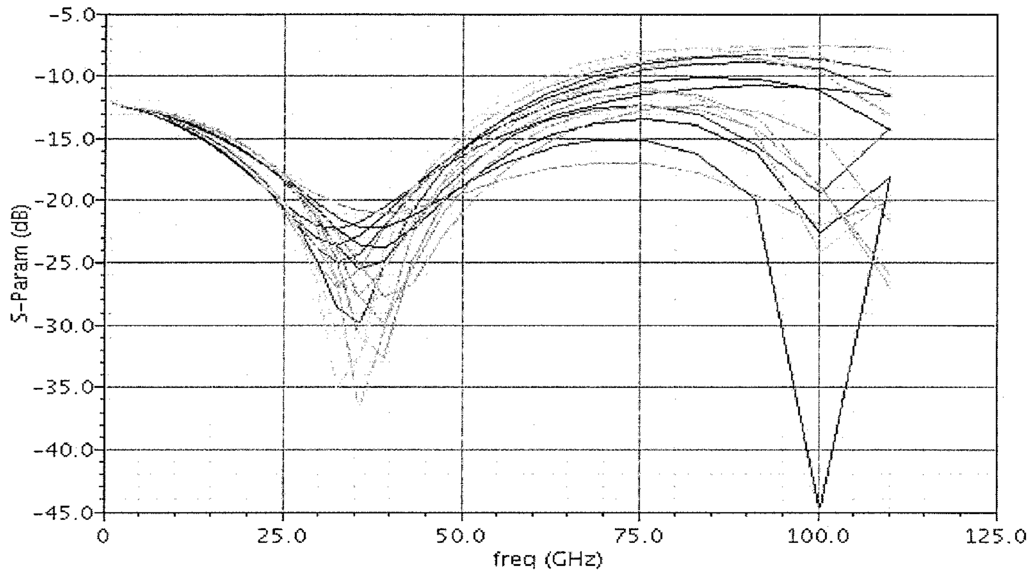
FIGS. 6-9 show performance graphs of the schematic of FIG. 5 in accordance with aspects of the present invention.

FIGS. 6-9 show performance graphs of the reconfigurable Wilkinson power divider of FIG. 5 in accordance with aspects of the present invention. FIG. 6 shows a performance graph of the reconfigurable Wilkinson power divider of FIG. 5 from $S_{11}$, i.e., power being input at port 10 and reflected back at port 10. In FIG. 6, an x-axis represents operating frequencies and a y-axis represents reflectivity of $S_{11}$. As shown in FIG. 6, the reconfigurable Wilkinson power divider of FIG. 5 is seen to achieve less than −20 dB reflectivity while operating between about 30-40 GHz, which signifies an improved reflectivity value. Additionally, FIG. 6 shows reflectivity less than −20 dB between about 90-110 GHz in select states. FIG. 6 further shows several other performance variations which can be obtained by the Wilkinson power divider of FIG. 5.

Figure 7:
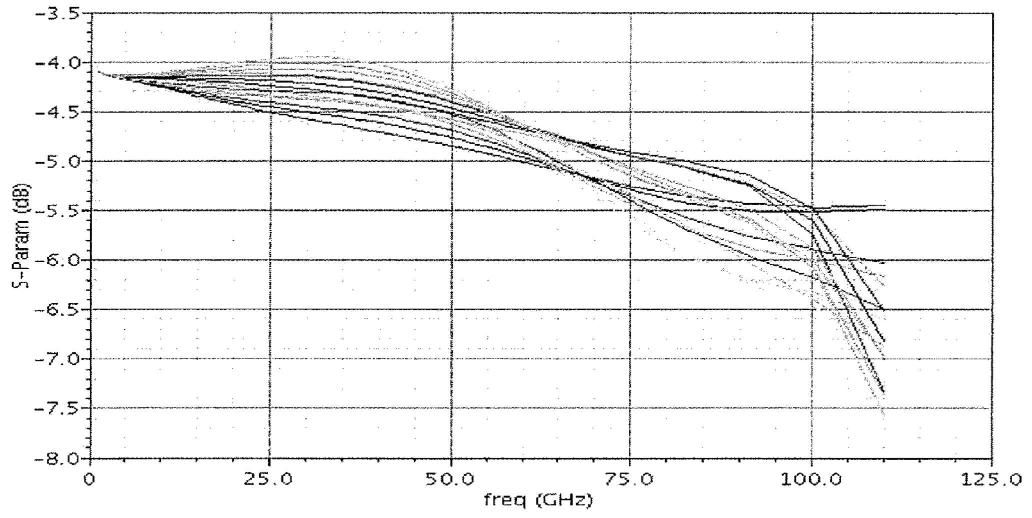

FIG. 7 shows a performance graph of the reconfigurable Wilkinson power divider of FIG. 5 from $S_{21}$ and $S_{31}$, i.e., power being input at ports 25 and 30 and being output at port 10, respectively. In FIG. 7, an x-axis represents operating frequencies and a y-axis represents power loss at $S_{21}$ and $S_{31}$. As should be understood by one having ordinary skill in the art, an ideal Wilkinson power divider incurs a 3 dB power loss, and in practical use, an acceptable power loss across a Wilkinson power divider is about 3.9 dB. In FIG. 7, an acceptable signal loss of about 3.9 dB is shown in the operating range of about 20-40 GHz. It is further seen in FIG. 7 that other operating losses are provided in different operating ranges, any of which may be acceptable depending on the design criteria. In the Wilkinson power divider 5 of the present invention, the tunability can be configured based on the tunable t-line circuits 20, and the different materials used to optimize the tunable t-line circuit 20. For example, thin metal layers can be used to optimize the Wilkinson power divider 5.

Figure 8:
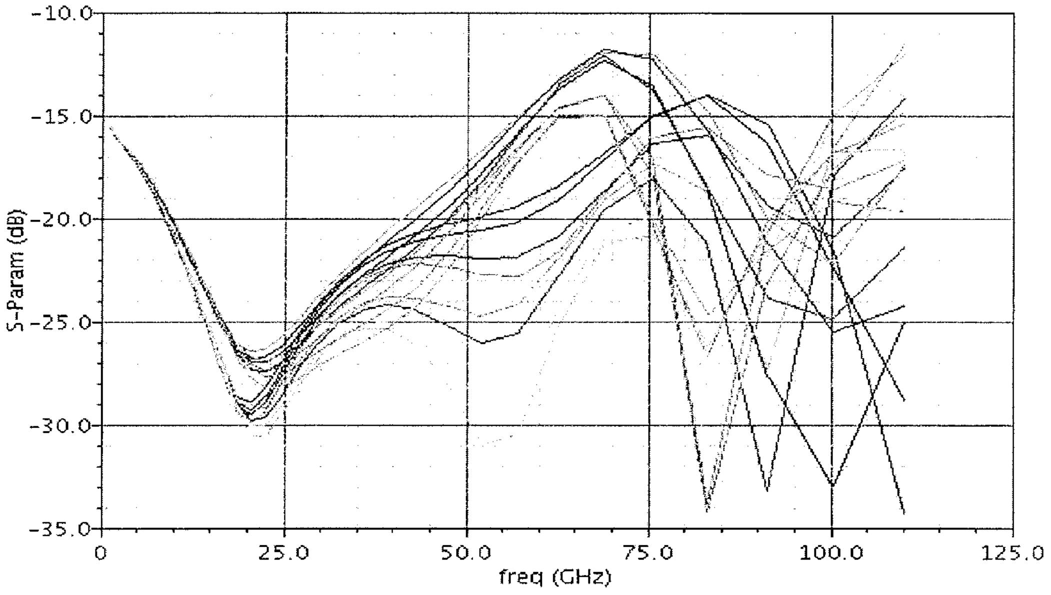

FIG. 8 shows a performance graph of the reconfigurable Wilkinson power divider of FIG. 5 from $S_{22}$ and $S_{33}$, i.e., power being input at ports 25 and 30 and reflected back at ports 25 and 30, respectively. In FIG. 8, an x-axis represents operating frequencies and a y-axis represents reflectivity of $S_{22}$ and $S_{33}$. This graph shows the reconfigurable Wilkinson power divider 5 achieves less than −20 dB reflectivity while operating at a wide range of frequencies, with all sixteen states achieving less than −20 dB reflectivity when operating between about 10-40 GHz; although other reflectivity is also achieved between other operating frequencies depending on the configuration.

Figure 9:
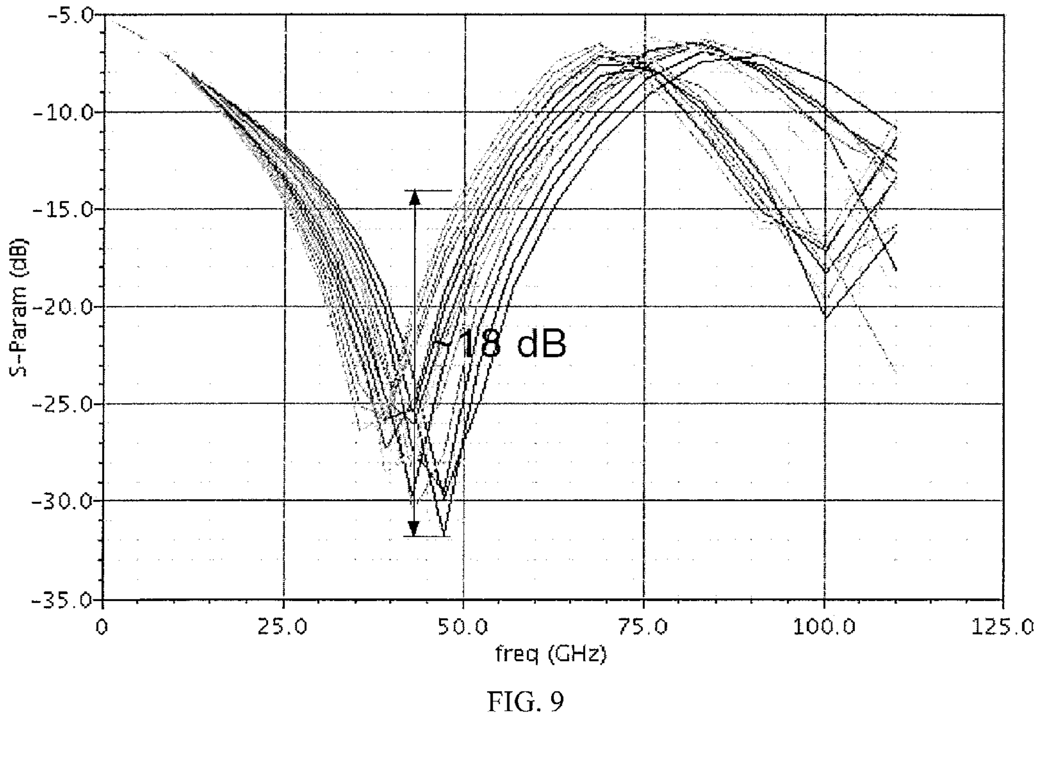

FIG. 9 shows a performance graph of the Wilkinson power divider of FIG. 5 from $S_{23}$, i.e., power being input at port 25 and being output at port 30. In FIG. 9, an x-axis represents operating frequencies and a y-axis represents isolation of $S_{23}$. As seen in FIG. 9, isolation of less than −20 dB can be achieved at frequencies from about 30-57 GHz. As such, the tunability of the reconfigurable Wilkinson power divider allows for the device to be reconfigured to optimize isolation. FIG. 9 also shows an isolation of about −18 dB at about 47 GHz.

Figure 10:
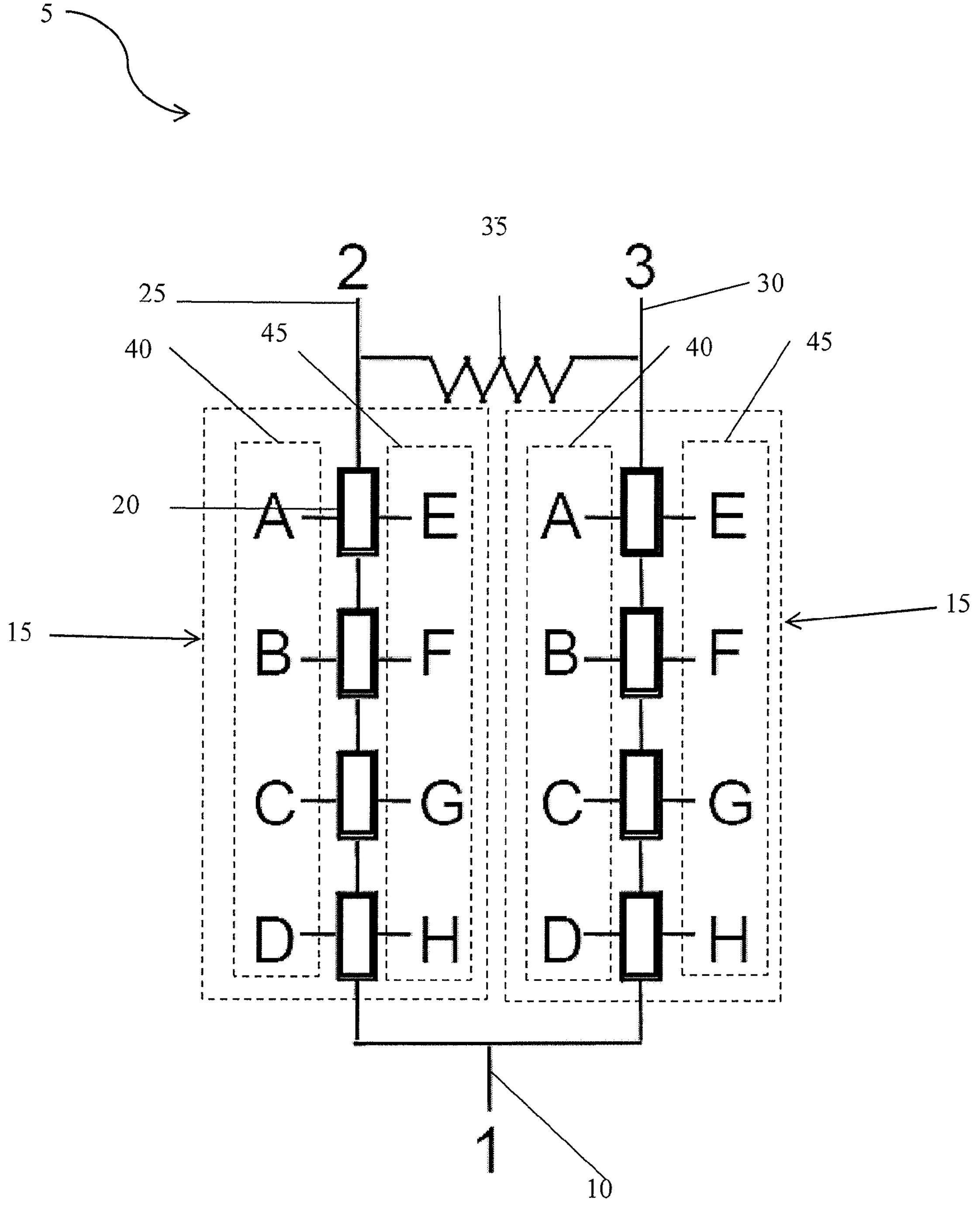
FIG. 10 shows a Wilkinson power divider with eight control bits in accordance with aspects of the present invention.

FIG. 10 shows a reconfigurable Wilkinson power divider 5 with eight control bits in accordance with aspects of the present invention. FIG. 10 shows a reconfigurable Wilkinson power divider 5 with control bits A-H, each associated with a group of tunable t-line circuits 20 within each arm 15. The control bits are connected to the FETs, which control the current in the inductance control line G2 or the capacitance of the signal line S in FIG. 2 or 3*a* of the tunable t-line section. In this embodiment, the inductance and capacitance are controlled independent of each other; however, the arms 15 are balanced (i.e., the impedance of the arms 15 are equal) because the control bits that control the inductance and capacitance of the first arm 15 also control the inductance and capacitance of the second arm. More specifically, control bits A-D control the inductance and E-H control the capacitance, and as such, the characteristic impedance may be modified. Because the device is operating with 8 bits, it has two-hundred fifty-six states (256), e.g. $2^8$; however, sixteen states will have a constant characteristic impedance. For example, an inductance control bit A is turned on and a capacitance control bit E is turned on, and the remaining bits B-D and F-H all remain at 0V. As a result, the present invention offers extensive flexibility to reconfigure a Wilkinson power divider to achieve a variety of performance enhancements. For example, this embodiment may be utilized to combat process variations.

Figure 11:
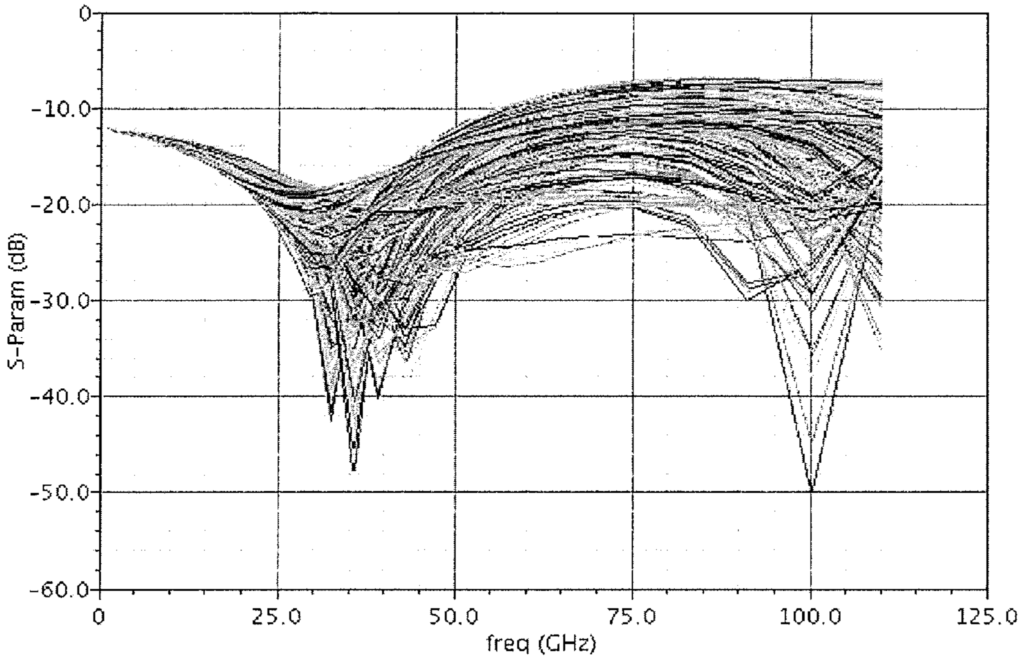
FIGS. 11-14 show performance graphs of the schematic of FIG. 10 in accordance with aspects of the present invention.

FIGS. 11-14 show performance graphs of the reconfigurable Wilkinson power divider of FIG. 10 in accordance with aspects of the present invention. FIG. 11 shows a performance graph of the Wilkinson power divider of FIG. 10 from $S_{11}$, i.e., power being input at port 10 and reflected back at port 10. In FIG. 10, an x-axis represents operating frequencies and a y-axis represents reflectivity of $S_{11}$. As shown in FIG. 11, the Wilkinson power divider of FIG. 10 is seen to achieve less than −20 dB reflectivity while operating between about 25-50 GHz. Additionally, FIG. 11 shows reflectivity of less than −20 dB at frequencies of about 95-105 GHz. FIG. 11 further shows several other performance variations which can be obtained by the Wilkinson power divider of FIG. 10.

Figure 12:
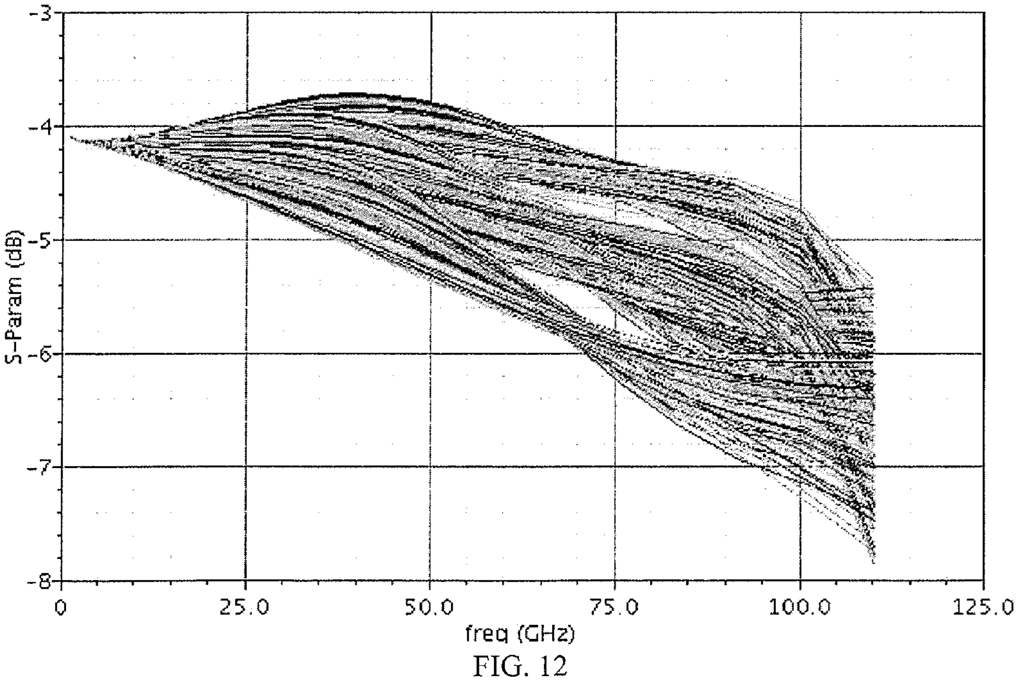

FIG. 12 shows a performance graph of the reconfigurable Wilkinson power divider of FIG. 5 from $S_{21}$ and $S_{31}$, i.e., power being input at ports 25 and 30 and being output at port 10, respectively. In FIG. 12, an x-axis represents operating frequencies and a y-axis represents power loss at $S_{21}$ and $S_{31}$. As should be known by one having ordinary skill in the art, an ideal Wilkinson power divider incurs a 3 dB power loss, and in practical use, an acceptable power loss across a Wilkinson power divider is about 3.9 dB. In FIG. 12, an acceptable signal loss of about 3.9 dB is shown in the operating range of about 15-60 GHz. It is further seen in FIG. 12 that other operating losses are provided in different operating ranges, any of which may be acceptable depending on the design criteria.

Figure 13:
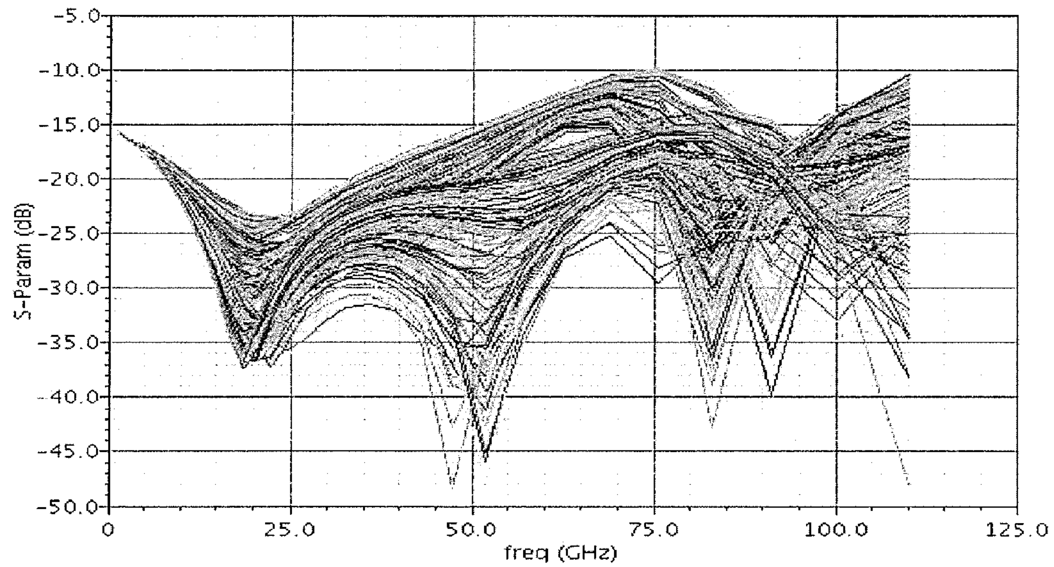

FIG. 13 shows a performance graph of the reconfigurable Wilkinson power divider of FIG. 10 from $S_{22}$ and $S_{33}$, i.e., power being input at ports 25 and 30 and reflected back at ports 25 and 30, respectively. In FIG. 13, an x-axis represents operating frequencies and a y-axis represents reflectivity of $S_{22}$ and $S_{33}$. This graph shows the reconfigurable Wilkinson power divider 5 achieves less than −20 dB reflectivity while operating at a wide range of frequencies, with all two hundred fifty-six states achieving less than −20 dB reflectivity when operating between about 13-33 GHz, although other reflectivity is also achieved between other operating frequencies depending on the configuration.

Figure 14:
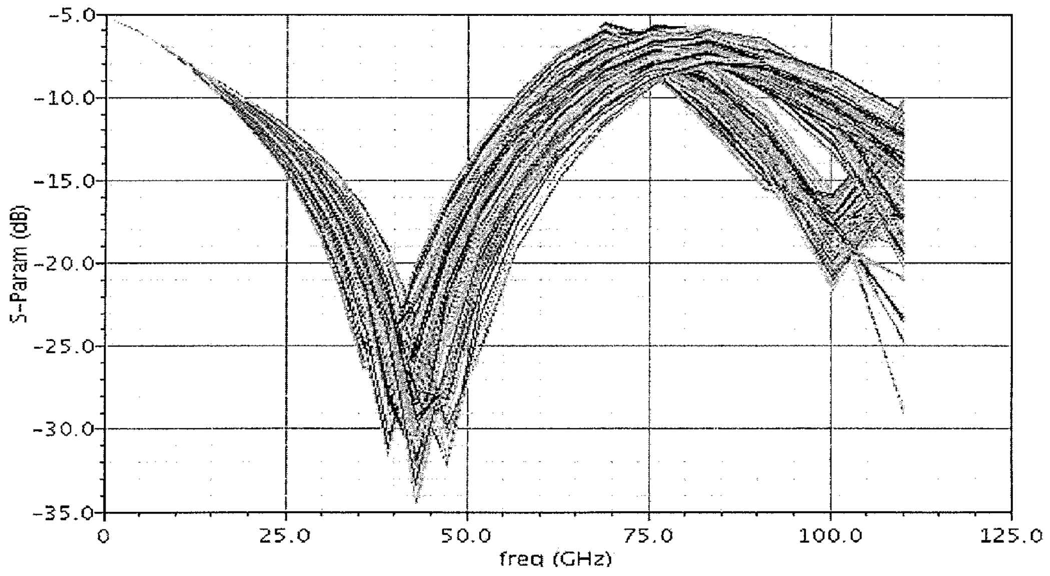

FIG. 14 shows a performance graph of the Wilkinson power divider of FIG. 10 from $S_{23}$, i.e., power being input at port 25 and being output at port 30. In FIG. 14, an x-axis represents operating frequencies and a y-axis represents isolation of $S_{23}$. As seen in FIG. 14, isolation of less than −20 dB can be achieved at frequencies from about 32-48 GHz. As such, the tunability of the reconfigurable Wilkinson power divider allows for the device to be reconfigured to optimize isolation.

Figure 15:
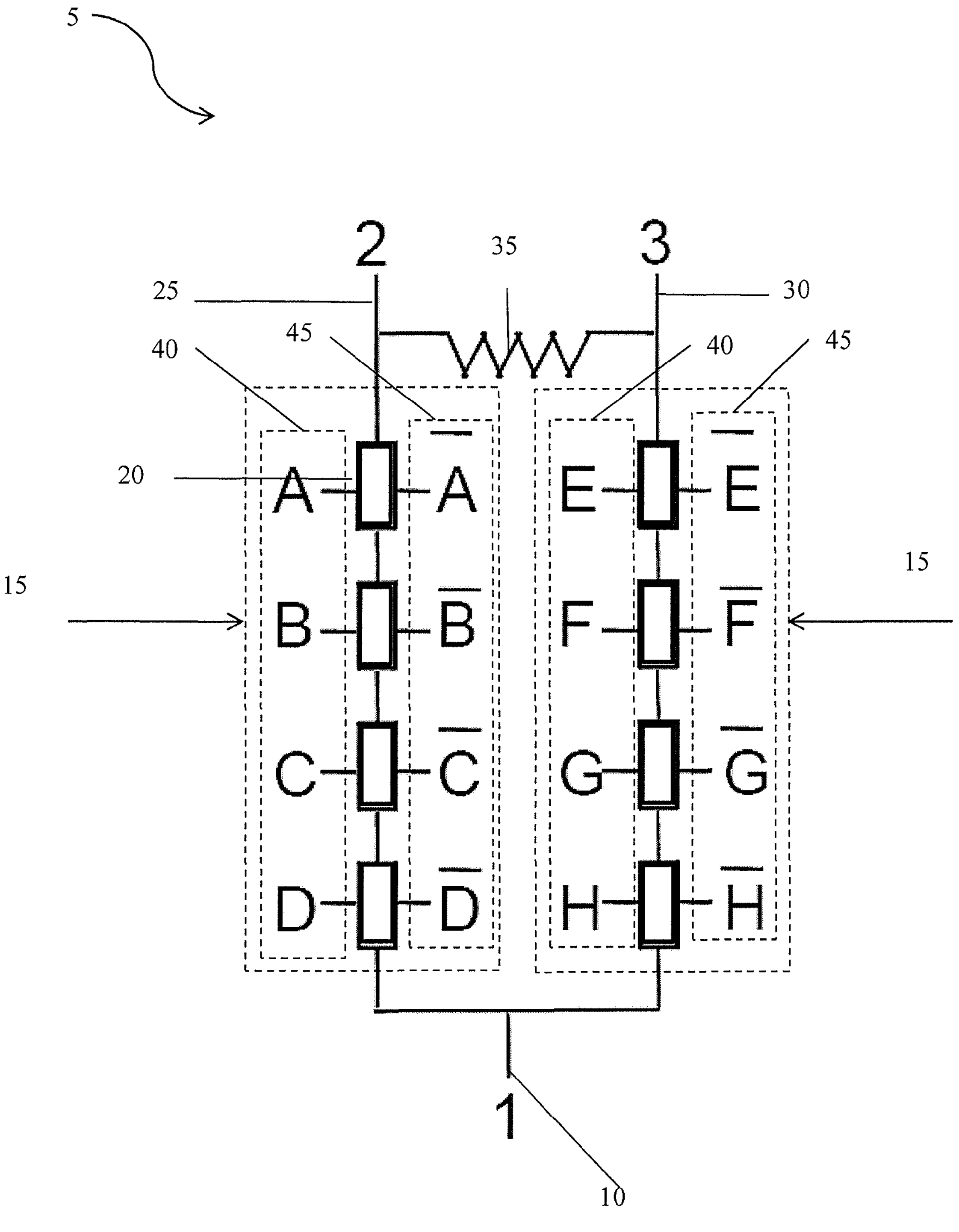
FIG. 15 shows a Wilkinson power divider with eight control bits in accordance with aspects of the present invention.

FIG. 15 shows a schematic of a reconfigurable Wilkinson power divider with eight control bits in accordance with aspects of the present invention. More specifically, FIG. 15 shows a reconfigurable Wilkinson power divider with control bits A-H. In this embodiment, control bits A-D and complementary bits $\overline{A}$-$\overline{D}$ control the first arm and control bits E-H and complementary bits $\overline{E}$-$\overline{H}$ control the second arm. The control bits are connected to the FETs, which control the current in the inductance control line G2 or the capacitance of the signal line S in FIG. 2 or 3*a* of the tunable t-line section. As such, the characteristic impedance will remain constant within each respective arm 15; however, the use of the tunable t-line circuits 20 enables the respective arms 15 to operate under different delays. Because the device is operating with 8 bits, it has two-hundred fifty-six states (256), e.g. $2^8$. For example, control bit A in the first arm 15 may be turned on and control bit E in the second arm 15 may be turned on. This embodiment may be utilized to minimize variations in $Z_o$, combat process variations and achieve frequency shifting.

Figure 16:
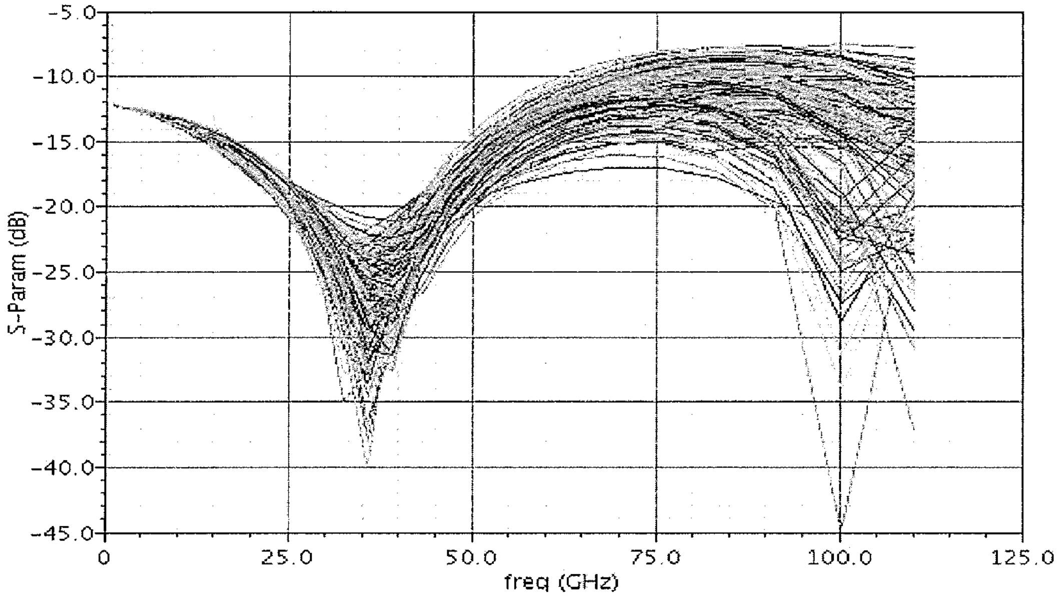
FIGS. 16-19 show performance graphs of the schematic of FIG. 15 in accordance with aspects of the invention.

FIGS. 16-19 show performance graphs of the Wilkinson power divider of FIG. 15 in accordance with aspects of the invention. FIG. 16 shows a performance graph of the reconfigurable Wilkinson power divider of FIG. 15 from $S_{11}$, i.e., power being input at port 10 and reflected back at port 10. In FIG. 16, an x-axis represents operating frequencies and a y-axis represents reflectivity of $S_{11}$. As shown in FIG. 16, the reconfigurable Wilkinson power divider of FIG. 15 is seen to achieve less than −20 dB reflectivity while operating between about 25-45 GHz, which signifies an improved reflectivity value. Additionally, FIG. 16 shows reflectivity less than −20 dB at frequencies between about 90-110 GHz in select states. FIG. 16 further shows several other performance variations which can be obtained by the Wilkinson power divider of FIG. 15.

Figure 17:
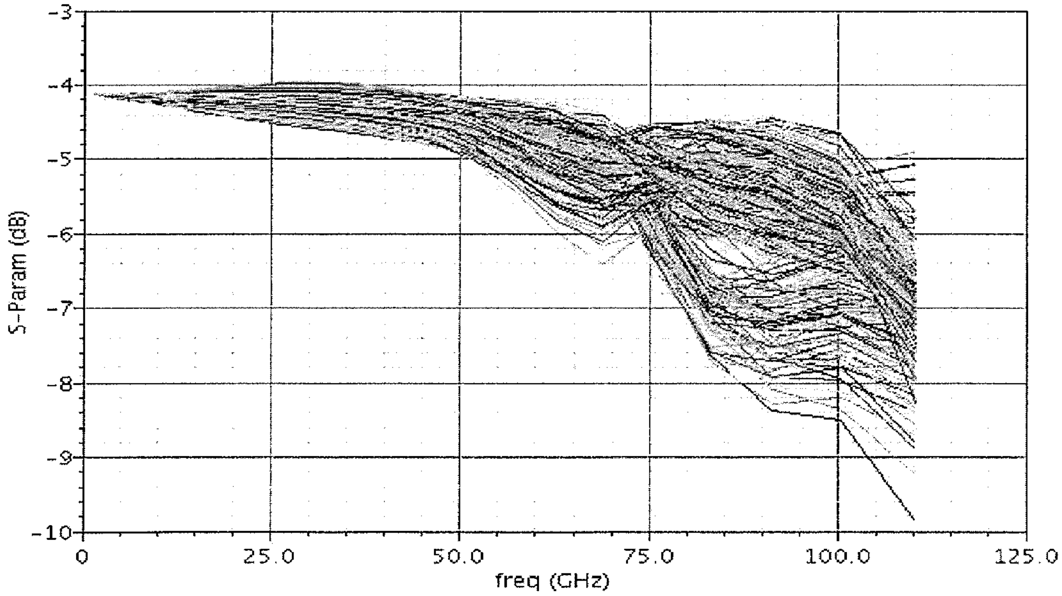

FIG. 17 shows a performance graph of the reconfigurable Wilkinson power divider of FIG. 15 from $S_{21}$ and $S_{31}$, i.e., power being input at ports 25 and 30 and being output at port 10, respectively. In FIG. 17, an x-axis represents operating frequencies and a y-axis represents power loss of $S_{21}$ and $S_{31}$. As should be known by one having ordinary skill in the art, an ideal Wilkinson power divider incurs a 3 dB power loss, and in practical use, an acceptable power loss across a Wilkinson power divider is about 3.9 dB. In FIG. 17, an acceptable signal loss of about 3.9 dB is shown in the operating range of about 20-40 GHz. It is further seen in FIG. 17 that other operating losses are provided in different operating ranges, any of which may be acceptable depending on the design criteria.

Figure 18:
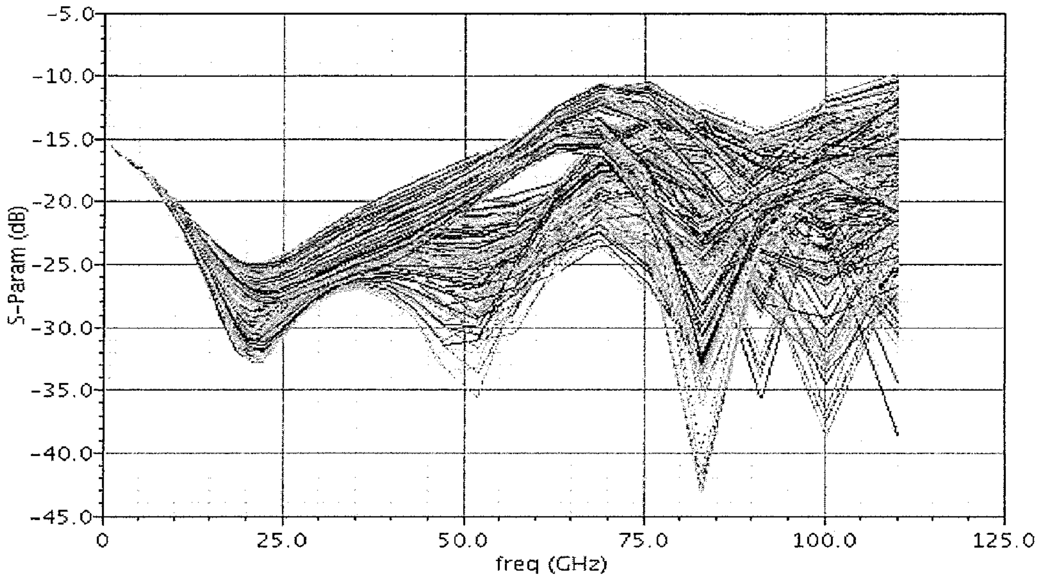

FIG. 18 shows a performance graph of the reconfigurable Wilkinson power divider of FIG. 15 from $S_{22}$ and $S_{33}$, i.e., power being input at ports 25 and 30 and reflected back at ports 25 and 30, respectively. In FIG. 18, an x-axis represents operating frequencies and a y-axis represents reflectivity of $S_{22}$ and $S_{33}$. This graph shows the reconfigurable Wilkinson power divider achieves less than −20 dB reflectivity while operating between about 10-40 GHz, although other reflectivity is also achieved between other operating frequencies depending on the configuration.

Figure 19:
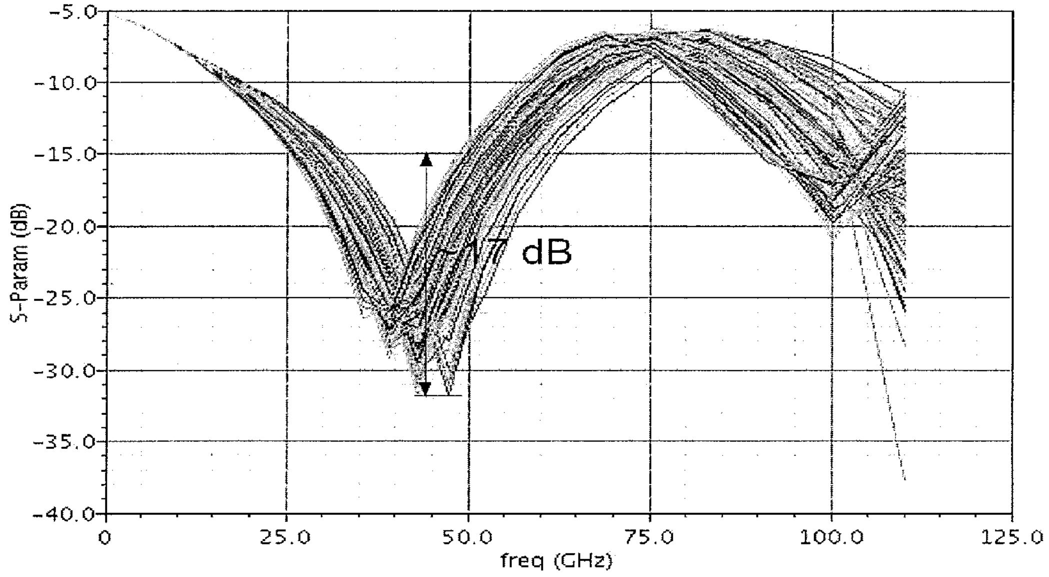

FIG. 19 shows a performance graph of the Wilkinson power divider of FIG. 15 from $S_{23}$, i.e., power being input at port 25 and being output at port 30. In FIG. 19, an x-axis represents operating frequencies and a y-axis represents isolation of $S_{23}$. As seen in FIG. 19, isolation of less than −20 dB can be achieved at frequencies from about 32-57 GHz. As such, the tunability of the reconfigurable Wilkinson power divider allows for the device to be reconfigured to optimize isolation.

Figure 20:
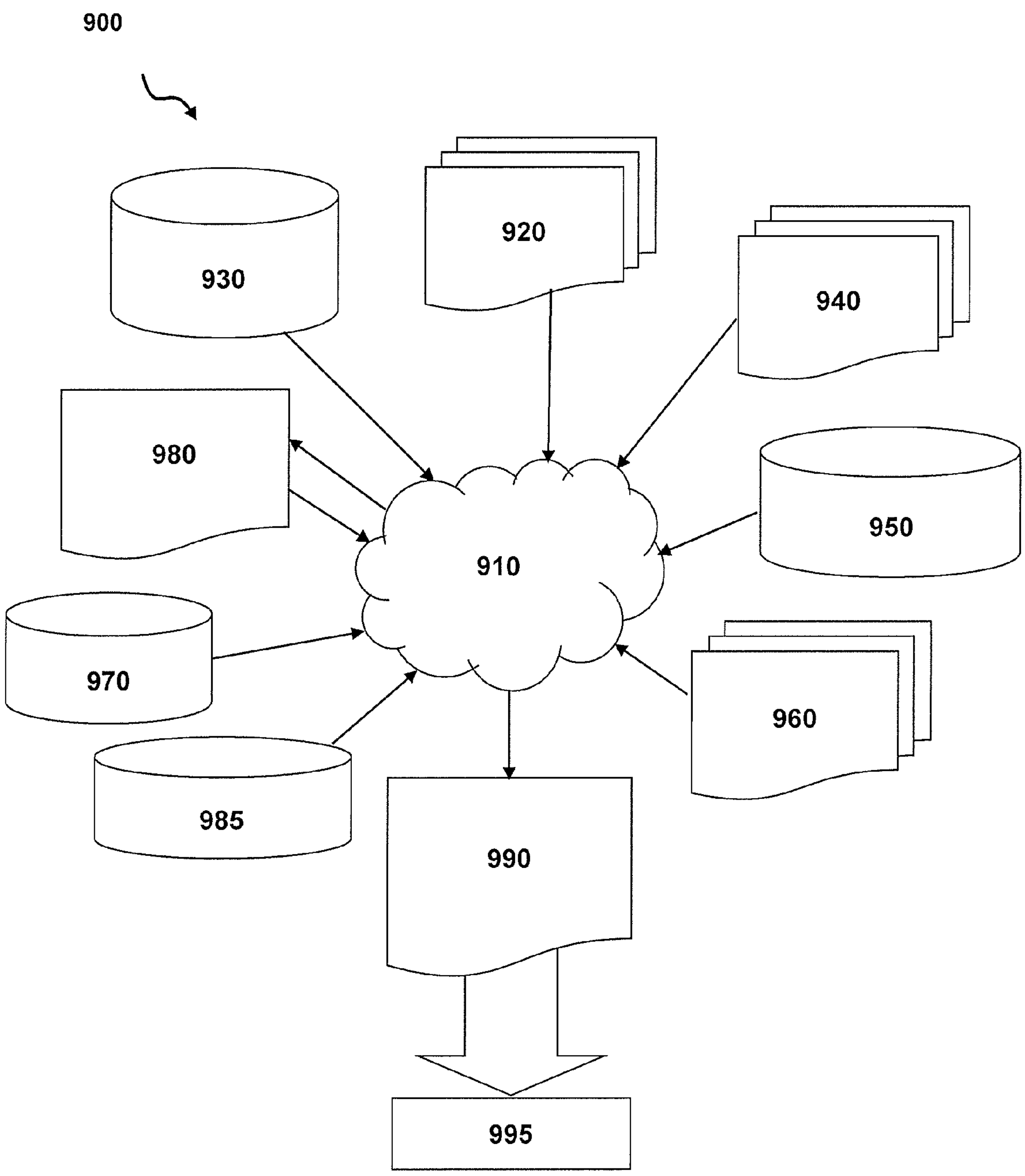
FIG. 20 is a flow diagram of a design process used in semiconductor design, manufacture, and/or test.

FIG. 20 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1, 2, 3_a_-3_c_, 4, 5, 10, and 15. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 20 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1, 2, 3_a_-3_c_, 4, 5, 10, and 15. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1, 2, 3_a_-3_c_, 4, 5, 10, and 15 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2, 3*a*-3*c*, 4, 5, 10, and 15. In one embodiment, design structure 990 may comprise a compiled, executable HDL simulation model that functionally simulates the devices shown in FIGS. 1, 2, 3*a*-3*c*, 4, 5, 10, and 15.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2, 3*a*-3*c*, 4, 5, 10, and 15. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:

a first port;

a first arm and a second arm connected to the first port, wherein the first arm and the second arm each comprise one or more tunable t-line circuits, and each tunable t-line circuit comprising ground return lines arranged adjacent to a control line and a signal line; and a second port and a third port connected to the first port via the first arm and second arm, respectively.

2. The structure of claim 1, wherein the first arm and the second arm have an equal number of the one or more tunable t-line circuits.

3. The structure of claim 1, wherein the first arm and the second arm include one or more groups of the one or more tunable t-line circuits.

4. The structure of claim 3, wherein the first arm and the second arm have an equal number of groups and an equal number of the one or more tunable t-line circuits within each group.

5. The structure of claim 4, wherein each successive group has a greater number of the one or more tunable t-line circuits than a previous group.

6. The structure of claim 3, wherein the first arm and the second arm have an equal number of groups and each group on the first arm has a different number of the one or more tunable t-line circuits and each group on the second arm has a different number of tunable t-line circuits, corresponding with the first arm.

7. The structure of claim 1, further comprising:

four control bits and four complementary control bits, each of which are associated with a group of the one or more tunable t-line circuits within the first arm and the second arm such that the structure has sixteen operating states, and each control bit is provided to the group of the one or more tunable t-line circuits by an inductance control or a capacitance control.

8. The structure of claim 1, further comprising:

eight control bits, each of which are associated with a group of the one or more tunable t-line circuits within the first arm and the second arm such that the structure has two-hundred fifty-six operating states, wherein four control bits are provided to the group of the one or more tunable t-line circuits by an inductance control and four bits are provided to the group of the one or more tunable t-line circuits by a capacitance control.

9. The structure of claim 1, further comprising:

four control bits and four complementary control bits, each of which are associated with a group of the one or more tunable t-line circuits of the first arm; and four control bits and four complementary control bits, each of which are associated with a group of the one or more tunable t-line circuits of the second arm, wherein:

the structure has two-hundred fifty-six operating states;

the four control bits are provided to the group of the one or more tunable t-line circuits in the first arm by an inductance control or a capacitance control; and the four control bits are provided to the group of the one or more tunable t-line circuits in the second arm by an inductance control or a capacitance control.

10. The structure of claim 1, wherein the one or more tunable t-line circuits comprises functionally-differentiated switches used for inductance and capacitance, respectively, wherein the functionally-differentiated switches comprise a first switch and a second switch.

11. The structure of claim 10, wherein:

the first switch comprises a first transistor connected in parallel with a first capacitor, and the first capacitor connected to a second capacitor in series; and the second switch comprises a second transistor connected to a resistor and the control line, wherein:

the transistor of the first switch is structured to switch a line capacitance through the signal line, and a transistor of the second switch is structured to switch a line inductance through inductor control lines.

12. The structure of claim 10, wherein:

the first switch comprises a transistor connected to a capacitor, in series, connected to the signal line; and the second switch comprises two transistors, in series, connected to inductance lines.

13. The structure of claim 1, further comprising a resistor connected between the second port and the third port.

14. A method comprising adjusting at least one of a capacitance or an inductance of a characteristic impedance of a power divider by turning on at least one of a first transistor of a first switch or a second transistor of a second switch of a tunable t-line circuit, wherein each tunable t-line circuit comprises ground return lines arranged adjacent to a control line and a signal line implemented in the power divider, thereby modifying an output signal of the power divider.

15. The method of claim 14, further comprising providing a control bit to the tunable t-line circuit by a capacitance control or an inductance control.

16. The method of claim 15, wherein the first switch and the second switch are functionally-differentiated switches used for capacitance and inductance, respectively.

17. The method of claim 16, further comprising:

reconfiguring the tunable t-line circuit to maintain a constant characteristic impedance while adjusting delays or to modify the characteristic impedance to at least one of: combat process variations, shift operating frequencies while optimizing isolation and matching, and match dynamic input/output loads.

18. The method of claim 14, further comprising:

providing four control bits and four complementary control bits by an inductance control or a capacitance control, each of which are associated with a group of tunable t-line circuits within a first arm and a second arm of the power divider such that the power divider has sixteen operating states.

19. The method of claim 14, further comprising:

providing eight control bits, each of which are associated with a group of tunable t-line circuits within a first arm and a second arm of the power divider such that the power divider has two-hundred fifty-six operating states, wherein:

four control bits are provided to the group of tunable t-line circuits by an inductance control; and four bits are provided to the group of tunable t-line circuits by a capacitance control.

20. The method of claim 14, further comprising:

providing four control bits and four complementary control bits, each of which are associated with a group of tunable t-line circuits of a first arm of the power divider;

providing four control bits and four complementary control bits, each of which are associated with a group of tunable t-line circuits of a second arm of the power divider, wherein:

the power divider has two-hundred fifty-six operating states;

the four control bits are provided to the group of tunable t-line circuits in the first arm by an inductance control or a capacitance control; and the four control bits are provided to the group of tunable t-line circuits in the second arm by an inductance control or a capacitance control.

21. A computer program product comprising a readable storage medium containing instructions that, if executed on a computing device, define a configurable Wilkinson power divider, wherein the instructions comprise the steps of:

generating a functional representation of a first port;

generating a functional representation of a first arm and a second arm connected to the first port, wherein the first and the second arm each comprise one or more tunable t-line circuits, wherein each tunable t-line circuit comprises ground return lines arranged adjacent to a control line and a signal line; and generating a functional representation of a second port and a third port connected to the first port via the first arm and second arm, respectively.

* * * * *